United States Patent [19]

Kocher et al.

[11] 4,386,436

[45] May 31, 1983

[54] TELEVISION REMOTE CONTROL SYSTEM FOR SELECTIVELY CONTROLLING EXTERNAL APPARATUS THROUGH THE AC POWER LINE

[75] Inventors: Christopher P. Kocher, Philadelphia; Abe Abramovich, Lawrenceville, both of Pa.

[73] Assignee: RCA Corporation, New York, N.Y.

[21] Appl. No.: 238,839

[22] Filed: Feb. 27, 1981

[51] Int. Cl.³ .................... H04N 5/44; H04B 11/00
[52] U.S. Cl. ........................... 455/151; 340/310 R; 358/194.1
[58] Field of Search ............... 455/151, 181, 603, 4; 340/310 R; 358/191.1, 194.1, 903

[56] References Cited

U.S. PATENT DOCUMENTS

| | | | |
|---|---|---|---|
| 2,250,371 | 7/1941 | Grimes | 455/151 |
| 3,866,307 | 5/1975 | Evans et al. | 178/73 R |
| 4,081,754 | 3/1978 | Jackson | 455/181 |
| 4,162,513 | 7/1979 | Beyers et al. | 358/191 |
| 4,289,930 | 9/1981 | Connolly et al. | 179/2 TV |
| 4,338,492 | 7/1982 | Snopko | 179/2 TV |

FOREIGN PATENT DOCUMENTS

| | | |
|---|---|---|
| 1396981 | 6/1975 | United Kingdom . |
| 2035017 | 6/1980 | United Kingdom . |
| 2043399 | 10/1980 | United Kingdom . |
| 1584111 | 2/1981 | United Kingdom . |
| 1590617 | 6/1981 | United Kingdom . |
| 2081948A | 2/1982 | United Kingdom . |

OTHER PUBLICATIONS

Siemens Digital Tuning System SDA210 w/ frequency Synthesis-1980-Siemens Components XV, No. 5 pp. 260, 261.
Article by S. A. Ciarcia, "Plug-In Remote Control System", Radio Electronics Magazine, pp. 47-51, published Sep. 1980.
Article by S. Ciarcia, "Computerize a Home", published 1/80, In Byte Magazine, pp. 28-54.
Electronic Servicing, p. 25, published 1/81.
B. Harden, "Teletext/Viewdata LSI", *IEEE Transactions on Consumer Electronics*, vol. CE-25, No. 3, Jul. 1979, pp. 353-358.
J. Hedger, "Telesoftware: Home Computing Via Broadcast Teletext", *IEEE Transactions on Consumer Electronics*, vol. CE-25, No. 3, Jul. 1979, pp. 279-287.
R. D. Bright, "Viewdata-A New Development by the UK Post Office", *National Electronics Review*, vol. 12, No. 1, Jan.-Feb. 1976, pp. 11 and 12.
E. Insam et al., International Broadcasting Convention Conference Paper, "An Integrated Teletext and Viewdata Receiver", pp. 113-116.
RCA Television Service Data Supplement, Chassis CTC-99 Series, File 1979 C-6-S2, pp. 1-3, 5-6 and 9.
"How to Operate Your RCA ColorTrak Auto-Programmer With 7-Day Memory", RCA, 1979.

*Primary Examiner*—Marc E. Bookbinder
*Attorney, Agent, or Firm*—E. M. Whitacre; P. J. Rasmussen; A. J. Jacobson

[57] ABSTRACT

A remote control system utilizes a portion of television receiver system to control an external appliance through the AC power supply line. The user enters an appliance control command into the keyboard of the television remote control unit. Inside the television receiver, the appliance control command is encoded and modulated onto a carrier signal which is transmitted on the AC power supply line. An external appliance control module, also connected to the AC power supply line, is located near the external appliance for detecting the encoded appliance control command and for selectively controlling the AC power supplied to the external appliance.

19 Claims, 3 Drawing Figures

ND UP, CHANNEL DOWN, VOLUME UP, VOLUME DOWN, or ON/OFF. Thus, the present invention is described as written above, with omissions and abbreviations.

TELEVISION REMOTE CONTROL SYSTEM FOR SELECTIVELY CONTROLLING EXTERNAL APPARATUS THROUGH THE AC POWER LINE

FIELD OF THE INVENTION

This invention relates to remote control systems in television receivers.

BACKGROUND OF THE INVENTION

Many television receivers include a remote control system which typically has a keyboard with pushbuttons for turning the television on and off, for controlling the sound level, and for selecting channels.

SUMMARY OF THE INVENTION

The present invention is concerned with a television remote control system that enables a user to control appliances external to the television receiver. For example, house lights may be turned on and off by appropriate command through the television remote control unit.

In a specific embodiment of the present invention, the television remote control unit is used to transmit appliance control data as well as television function control data to the television receiver. Inside the television receiver, a decoder decodes the transmitted data. When the data is of a first predetermined type, television function control apparatus responds to control television functions. When the data is of a second predetermined type, appliance control apparatus responds to encode the data to form an appliance control signal suitable for controlling an external appliance. The appliance control signal is modulated and transmitted to the external appliance through the alternating current (AC) power supply line.

DETAILED DESCRIPTION

Figure 1:
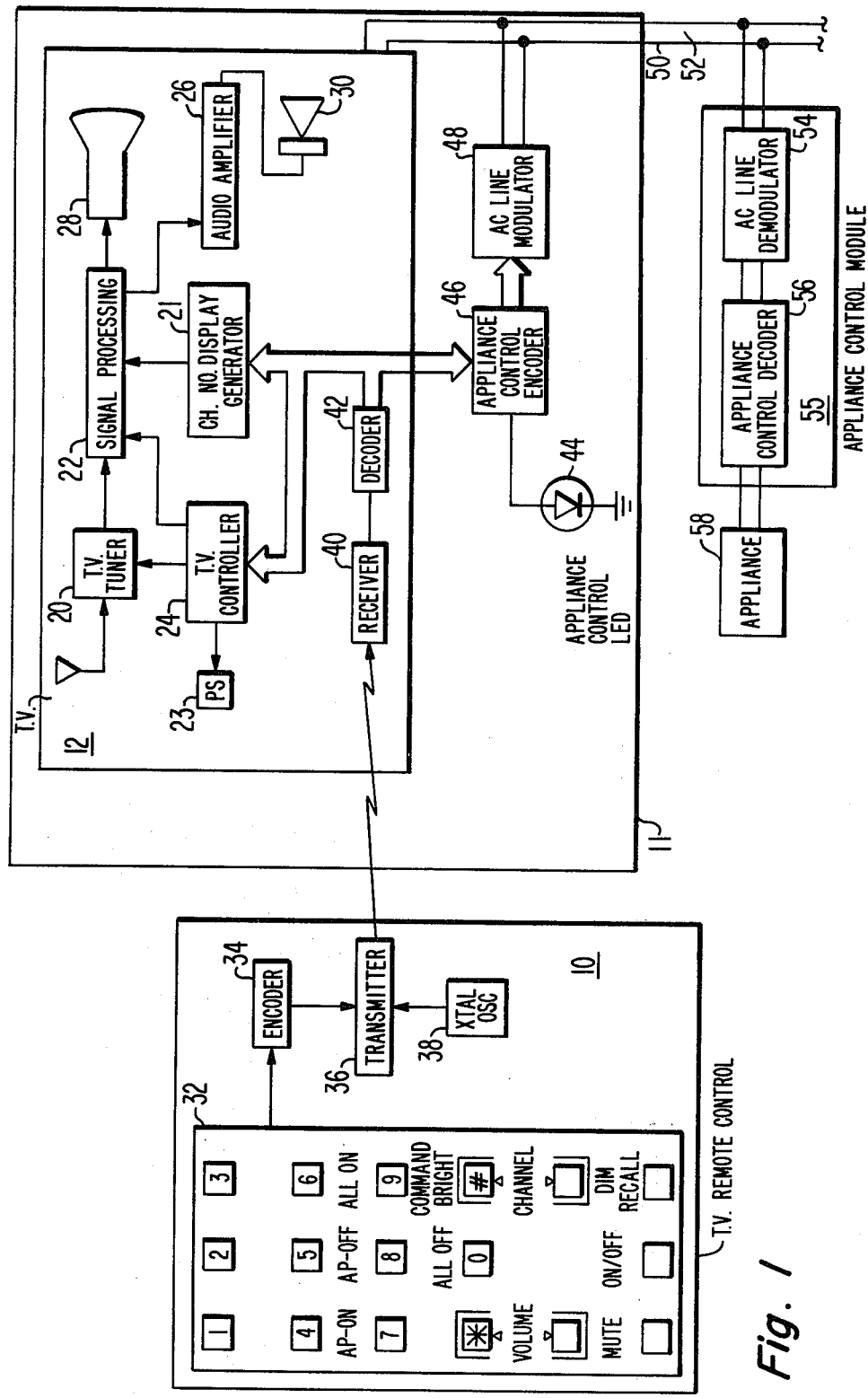
FIG. 1 is a block diagram of a television remote control system embodying the present invention.

FIG. 1 shows an arrangement whereby an electrically operated device which receives power from the AC line, indicated as an appliance 58 which may be an electric light, a relay, a motor, etc., is controlled by using a television remote control unit 10. The television remote control unit 10 comprises a keyboard 32 for entering data, an encoder 34 for generating a digitally encoded message in accordance with the data entered, and a transmitter 36 for generating a carrier signal modulated in accordance with the encoded message. A crystal oscillator 38 provides a stable carrier frequency for the transmitter 36. A television remote control unit which uses infrared (IR) light as the transmitted carrier signal is described in the "RCA Engineer", published April 1980, pages 34-37, which is hereby incorporated by reference.

The television receiver 11 includes a TV (television) portion 12 comprising a tuner 20, a picture tube 28, an on-screen channel number display generator 21, an audio amplifier 26, a speaker 30, a signal processing circuit 22, and a power supply 23 which function as a conventional television receiver. TV portion 12 further includes a remote control receiver 40 for receiving the carrier signal transmitted from remote control unit 10 and extracting the modulating signal and a decoder 42 for decoding the digitally encoded message. The digitally decoded message is applied to TV controller 24 and channel number display generator 21 which are responsive to predetermined data relating to television control functions and apply control signals to respective television components. Typical television control functions include channel selection by means of tuner 20, sound level adjustment including a MUTE function which eliminates the audio portion of the TV program by means of audio amplifier 26, television on/off control by means of the power supply 23, and "channel number recall" for causing the channel number of the presently selected channel to be displayed within the image produced by picture tube 28.

Control of devices, such as appliance 58, external to the television receiver 11 is provided by an appliance control encoder 46 and an AC line modulator 48, the latter being connected to the AC power lines 50 and 52, within television receiver 11. A light emitting diode (LED) 44 is mounted on television receiver 11 to provide an indication when the television remote control system is being used to control external devices. An appliance control module 55 is connected between the AC lines 50, 52 and the external appliance 58. The appliance control module includes apparatus which function as an AC line demodulator 54 and an appliance control decoder 56.

As indicated by the legends next to the buttons on keyboard 32, the same pushbuttons that control TV portion 12 are also used to control remote appliances. Specifically, the appliance control mode is entered by pressing button 9 (COMMAND). In the United States, there is no television channel number that has a 9 as the tens digit. Thus, the shared use of the 9 button is desirable since an additional button for mode selection is not needed. Since 9 does not correspond to the tens digit of a valid channel number, or any other television control function, TV controller 24 ignores it as well as further data. However, appliance control encoder 46 is enabled to decode further data. At this point, appliance control encoder 46 provides power to the appliance control LED 44 to indicate to the user that the system is in the appliance control mode.

Six separate appliances may be controlled from the remote control unit 10. To control a specific appliance, one of buttons 1 through 6 is pressed. Appliance control encoder 46 recognizes data after the COMMAND data (i.e. that corresponding to a 9 in the tens digit of a selected channel number) and provides a corresponding encoded appliance control signal to AC line modulator 48. The AC line modulator 48 superimposes an encoded signal corresponding to the appliance control signal onto the AC voltage on power lines 50 and 52.

The encoded signal on the AC power lines is detected by AC line demodulator 54 which couples a decoded appliance control signal to appliance control decoder 56. The appliance control decoder 56 recognizes its unique code (between 1 and 6) and is activated to receive further commands, e.g., to cause AC power to be coupled or decoupled from appliance 58.

After an appliance is selected by pressing one of the buttons 1 through 6, the selected appliance is then controlled by pressing one of the buttons 7, 8, 9, CHAN- NEL UP, or CHANNEL DOWN corresponding to an appliance control command. For example, if button 7 is pressed, appliance 58 will turn on. If button 8 is pressed, appliance 58 will turn off. If CHANNEL UP is pressed, the illumination will grow brighter so long as that button is pressed down (assuming that appliance 58 is a lamp). If the CHANNEL DOWN is pressed, the illumination will grow dimmer so long as that button is pressed down. To control other appliances (not shown) a different button between 1 and 6 is pressed and subsequent commands are entered. The ALL ON button will turn on all lights. The ALL OFF button will turn off all devices.

Appliance control mode is disabled by pressing the RECALL button. Alternatively, appliance control mode is automatically disabled after 16 seconds during which no appliance data is entered. Disabling appliance control mode returns the television remote control system to its normal television control function. The above described control functions are summarized in Table I below.

TABLE I

| Button | Command |
|---|---|
| 9 | Enable Control Mode |
| 1-6 | Select particular device for control |
| 7 | Turn selected device on |
| 8 | Turn selected device off |
| 9 | Turn all lights on |
| 0 | Turn all devices off |
| CHANNEL UP | Increase AC power to selected device |
| CHANNEL DOWN | Decrease AC power to selected device |
| RECALL | Disable Control Mode |

Figure 2:
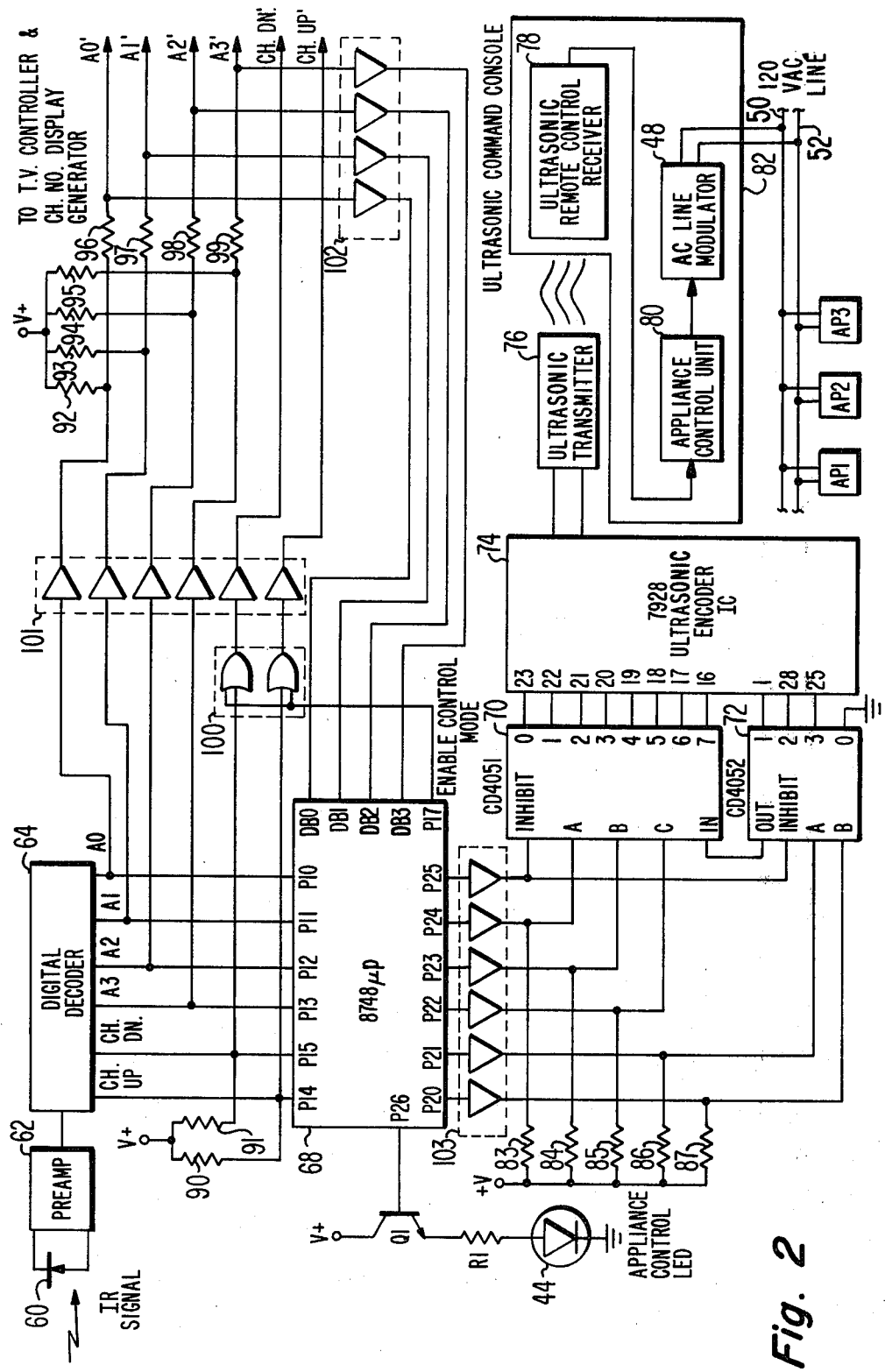
FIG. 2 is a schematic diagram, partially in block form, illustrating further details of the television remote control system of FIG. 1.

FIG. 2 shows further details of the television receiver 11 and appliance control encoder 46. An IR sensitive diode 60 is coupled to a preamplifier 62 and a digital decoder 64. The output of the digital decoder 64 is a data buss comprising data bits A0, A1, A2, A3, CH UP, and CH DN. The data buss is connected to a microprocessor 68, and, through NOR gates 100 and buffer amplifiers 101, to TV controller 24 and channel number display generator 21 (FIG. 1).

Microprocessor 68 is also coupled through buffer amplifiers 103 to a pair of multiplexers 70 and 72 which control an ultrasonic encoder 74. The output of the ultrasonic encoder 74 is a sequential digital data signal representative of the appliance control data and is fed to an ultrasonic transmitter 76 which provides an ultrasonic signal to an ultrasonic command console 82. The ultrasonic command module 82 comprises an ultrasonic receiver 78, an appliance control unit 80, and an AC line modulator 48 which re-encodes the appliance control data as a second sequential digital data signal for transmission on the AC power lines. In such manner, the command module 82 communicates with compatible appliance control modules AP1, AP2, and AP3 over the 120 VAC power lines.

The link between the television receiver and the AC power lines is provided by using commercially available products from BSR, Ltd., Blauvelt, N.Y. Specifically, BSR Model CC401 ultrasonic cordless controller, which contains the ultrasonic encoder 74 (IC type 7928) and the ultrasonic transmitter 76, is modified and interfaced to the television receiver. A BSR Ltd. Model UC301 ultrasonic command console 82 is connected to the AC power lines. Compatible remote modules AP1, AP2, and AP3 for controlling appliances including dimmer modules for controlling lights, are available from BSR Ltd.

The multiplexers 70 and 72 simulate the button depressions that are the normal input to the ultrasonic encoder 74. That is, a pushbutton keyboard is normally connected to ultrasonic encoder 74 so that for each button depression thereof, one of pins 1, 28 and 25 is connected to one of pins 16 through 23. Multiplexer 70, an eight line-to-one line switch, and multiplexer 72, a four line-to-one line switch (both available from RCA Corporation as integrated circuit (IC) types CD4051 and CD4052 respectively), are controlled by microprocessor 68 to selectively interconnect appropriate pins of ultrasonic encoder 74.

For example, when the A, B, and C inputs to multiplexer 70 (from microprocessor 68) are at logical 1, 0, and 1 respectively (and the inhibit input to multiplexer 70 is at logic 0), then pin 18 of the ultrasonic encoder 74 is selected by multiplexer 70. Simultaneously, if the A and B inputs to multiplexer 72 are at logic 1 and 0 respectively, then pin 1 of the ultrasonic encoder 74 is selected by multiplexer 72. Since the output of multiplexer 72 is connected to the input to multiplexer 70, pins 1 and 18 of the ultrasonic encoder 74 are connected together. When the inhibit signal is at logic 1, multiplexers 70 and 72 do not interconnect any pins of the ultrasonic encoder 74.

Table II below gives the pin connection assignments corresponding to respective appliance control signals generated by the ultrasonic encoder 74. Continuing the above example, when pins 1 and 18 of the ultrasonic encoder 74 are connected together, the ultrasonic encoder 74 will send out an appliance control signal corresponding to appliance 5. As a further example, when pins 25 and 20 are connected together, the ultrasonic encoder 74 will generate an appliance control signal corresponding to the ON command. Device codes 7–16, shown in parenthesis in Table II, are unused since only device codes 1–6 are used in the present embodiment.

TABLE II

|  | Pin 1 | Pin 28 | Pin 25 |
|---|---|---|---|
| Pin 23 | (15) | (16) | Dim |
| Pin 22 | (11) | (12) | Off |
| Pin 21 | (13) | (14) | All Off |
| Pin 20 | 3 | 4 | On |
| Pin 19 | (7) | (8) | Bright |
| Pin 18 | 5 | 6 | All lamps on |
| Pin 17 | 1 | 2 | Unused |
| Pin 16 | (9) | (10) | Unused |

The particular television receiver used in the present embodiment is an RCA 1981 Model FER498WR wherein the data buss comprising data bits A0, A1, A2, A3, CH UP, and CH DN operates as follows. When the CHANNEL UP button at the remote control keyboard is pressed, the CH UP bit goes low (logic 0 in positive logic notation), and the CH DN bit goes high (logic 1 in positive logic notation). When the CHANNEL DOWN button is pressed, the CH DN bit goes low and the CH UP bit goes high. When no buttons are pressed, CH UP and CH DN bits are both normally high. The CH UP and CH DN bits also serve as a strobe signal for the remaining data bits A0, A1, A2, and A3. That is, bits A0 through A3 transmit data corresponding to buttons 0 through 9 in complemented binary form. However, the data on bits A0 through A3 is valid for controlling appliances only when CH UP and CH DN data bits are both low. Microprocessor 68 causes data bits CH UP and CH DN to both become low when it detects that the appliance control mode has been entered by button 9 (COMMAND) having been pressed. Table III, below, summarizes the data buss codes for respective buttons on the remote control unit keyboard.

TABLE III

| Button | Data Buss | | | | | | Multiplexer 72 BA | Multiplexer 70 CBA | Inhibit |
|---|---|---|---|---|---|---|---|---|---|
| | CH DN | CH UP | A3 | A2 | A1 | A0 | | | |
| 0 (ALL OFF) | 0 | 0 | 1 | 1 | 1 | 1 | 11 | 010 | 0 |
| 1 | 0 | 0 | 1 | 1 | 1 | 0 | 01 | 110 | 0 |
| 2 | 0 | 0 | 1 | 1 | 0 | 1 | 10 | 110 | 0 |
| 3 | 0 | 0 | 1 | 1 | 0 | 0 | 01 | 011 | 0 |
| 4 | 0 | 0 | 1 | 0 | 1 | 1 | 10 | 011 | 0 |
| 5 | 0 | 0 | 1 | 0 | 1 | 0 | 01 | 101 | 0 |
| 6 | 0 | 0 | 1 | 0 | 0 | 1 | 10 | 101 | 0 |
| 7 (ON) | 0 | 0 | 1 | 0 | 0 | 0 | 11 | 011 | 0 |
| 8 (OFF) | 0 | 0 | 0 | 1 | 1 | 1 | 11 | 001 | 0 |
| 9 (ALL ON) | 0 | 0 | 0 | 1 | 1 | 0 | 11 | 101 | 0 |
| CH UP (BRIGHT) | 1 | 0 | X | X | X | X | 11 | 100 | 0 |
| CH DN (DIM) | 0 | 1 | X | X | X | X | 11 | 000 | 0 |
| RECALL | 0 | 0 | 0 | 0 | 0 | 0 | XX | XXX | 1 |

X = Don't care states

In an unmodified television receiver, the data buss output (A0, A1, A2, A3, CH UP, and CH DN) of digital decoder 64 is directly connected to the data buss input (A0', A1', A2', A3', CH UP', and CH DN) of TV controller 24 (FIG. 1). See RCA Service data 1980 C-7-S1 for a schematic (MCR1011A) corresponding to digital decoder 64, and a schematic (MCS009A) corresponding to TV controller 24. In the present embodiment, buffers 101 and OR gates 100 are interposed between digital decoder 64 and TV controller 24 to connect respective bits of the data buss through appropriate non-inverting amplifiers. Buffers 101 and OR gates 100 may be realized using IC Types 7417, and CD4071 respectively. Resistors 90, 91, 92 93, 94, 95, 96, 97, 98 and 99 are connected to provide the proper voltage level for respective data bit lines.

Also, in normal operation, the data bits A0', A1', A2' and A3' (in addition to transmitting signals representing data entered at the remote control unit) are also used to transfer data between the TV controller 24 and the channel numbers display generator 21 (FIG. 1). Specifically, when data bits CH UP and CH DN (the strobe signals) are both high, data bits A0', A1', A2', and A3' are used to transmit data from the TV controller 24 to the channel number display generator 21 which data represents the units digit of the currently selected viewing channel. Consider for example, the channel selection 43. After the 4 digit is entered, the TV controller generates signals to the channel number display generator to display a "4-" on the television screen. At that time, data bits A0', A1', A2', and A3' represent a digital code for a "-", i.e., a hexidecimal code E or the binary code 0111 respectively. After the 3 digit is entered, data bits A0' through A3' represent the digital code for a "3". The dual use of the data bits A0' through A3' for both entering data and displaying channel selection is advantageously used by the microprocessor 68 for detecting when the user has selected a channel with a 9 in the tens digit.

A microprocessor adaptable for use with the present invention is a type 8748 available from Intel Corporation. Ports P10, P11, P12, P13, P14 and P15 are connected to respective data bits A0, A1, A2, A3, CH UP, and CH DN. Port P26 is connected to drive LED 44 through resistor R1 and transistor Q1 in emitter follower configuration. Port 17 is connected to OR gates 100 for disabling the strobe signals (CH UP and CH DN) from the TV controller when the system is in appliance control mode. Data bits DB0, DB1, DB2, and DB3 are connected to receive respective data bits A0', A1', A2', and A3' through buffer amplifiers 102 (IC Type CD4050). Ports P20, P21, P22, P23, P24 and P25 are connected through buffer amplifiers 103 (IC Type 7417) to control multiplexers 70 and 72. Resistors 83, 84, 85, 86 and 87 are pull-up resistors which provide proper signal level inputs to multiplexers 70 and 72.

The 8748 microprocessor is provided with an integral erasable read only memory, which is useful for developing prototype programs. However, in production, a microprocessor or other controller with mask programmable read only memory would be more economical.

Microprocessor 68 is programmed to provide control functions and data translation functions between digital decoder 64 and multiplexers 70 and 72. Table III lists the required control signal inputs to multiplexers 70 and 72 for each corresponding data buss code. A flow chart of the control program for the microprocessor 68 is shown in FIG. 3.

Figure 3:
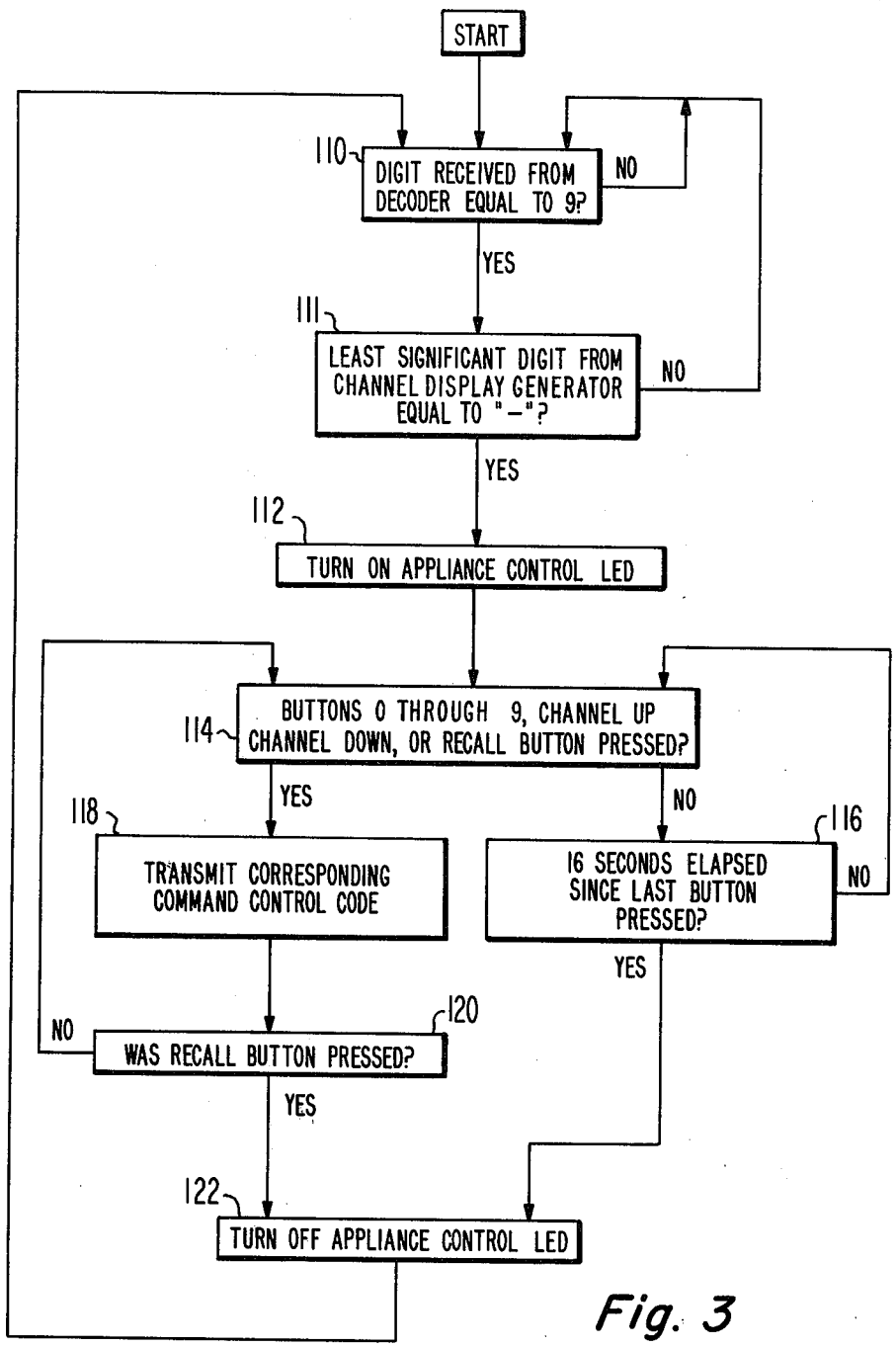
FIG. 3 is a flow chart representative of the control program for a microprocessor shown in FIG. 2.

The operation of the system of FIG. 2 will be considered in conjunction with the flow chart of FIG. 3. Initially, port P17 is set low, enabling OR gates 100 to transmit CH UP and CH DN signals to the TV controller. Also, port P25 is set high, inhibiting operating of multiplexers 70 and 72, and port P26 is set low so that LED 44 is off.

After initialization, microprocessor 68 reads data representing each subsequent button entry on ports P10 through P15. When a 9 digit is received (step 110), the microprocessor proceeds (in step 111) to read data bits DB0 through DB3. If data bits DB0 through DB3 represent a "-" (Code E), then the tens digit of a selected channel is equal to 9 and appliance control mode is entered in step 112, which turns on appliance control LED 44 by setting port P26 high. Port P17 is also set high in appliance control mode, disabling OR gates 100 so that CH UP and CH DN signals are not transmitted to the TV controller. The CH UP and CH DN signals (the strobe signals) are thus disabled so that subsequent appliance control data will not inadvertently interfere with regular television control functions.

For each subsequent digit received, i.e., data representing 0 through 9, CH UP or CH DN, a corresponding output on ports P20 through P25 is generated by the program (step 118) to multiplexers 70 and 72 in accordance with the relationship given in Table III. If no button is pressed for 16 seconds, appliance control mode is terminated (step 116) by setting port P26 low which turns off LED 44 (step 122), and setting port P17 low enabling OR gates 100 which enables CH UP and CH DN signals to be gated to the TV controller. Alternatively, if the code for the RECALL button was received in step 120, then P26 and P17 are set low terminating appliance control mode (step 122). The program then returns to the beginning (step 122).

The use of readily available ultrasonic components provides a convenient interface between the television receiver and the AC power line which minimizes the risk that low power circuits in the television receiver will be accidently exposed to 120 VAC line voltage. Also, the ultrasonic encoder 74 and ultrasonic transmitter 76 may be contained inside the television receiver, while the ultrasonic command console, which has a keyboard for alternate data entry, can be placed at any convenient location near the television receiver. However, the ultrasonic link has a relatively slow response and increases total system cost. Therefore, a mass produced system would be made more cost effective using a direct interface between the television receiver and the AC power line, thereby eliminating the ultrasonic link. Also, isolation between the appliance control encoder and the AC power lines may be achieved by the use of an optical isolator.

More than six appliances may be controlled by providing additional buttons on the remote control keyboard, as well as additional encoding and decoding apparatus to accommodate the additional device codes. The disclosed system may also be configured to provide for programmability of external appliances. For example, microprocessor 68 may be arranged to be programmable by the user to turn selected appliances on and off at future dates and times. Furthermore, for cost effectiveness, the control function performed by the microprocessor 68 can be advantageously combined with the control functions provided in the television receiver, thereby eliminating the need for a separate microprocessor.

What is claimed is:

1. In a remote control television system including a remote control unit having a transmitter means for transmitting a carrier signal, keyboard means for entering data, and encoder means for modulating said carrier signal in accordance with said entered data, and further including a television receiver having receiving means for receiving said carrier signal, decoding means for demodulating said entered data, and television function control means coupled to said decoding means for controlling various functions of said television receiver in response to a first predetermined type of data received from said decoding means, the improvement comprising:

appliance control means coupled to said decoding means for generating an appliance control signal in response to a second predetermined type of data received from said decoding means; and alternating current line modulator means coupled to an alternating current power supply line for applying an encoded signal representative of said appliance control signal to said alternating current power supply line.

2. In a remote control television system in accordance with claim 1, wherein said keyboard means includes means for entering numeric data corresponding to a selected television channel, and said second predetermined type of data is characterized by a number having at least one digit corresponding to an unused selected television channel, the improvement further comprising:

said appliance control means including mode control means for detecting when said data received from said decoding means represents said number corresponding to said unused selected television channel.

3. In a remote control television system in accordance with claim 1 wherein said keyboard means includes means for entering numeric data corresponding to first and second digits of the channel number of the channel to be selected, and said second predetermined type of data being characterized by a sequence of numbers having a first number thereof corresponding to the number 9, the improvement further comprising:

said appliance control means including mode control means for detecting said first number of said data received from said decoding means represents the number 9.

4. In a remote control television system in accordance with claim 1, 2 or 3, the improvement further comprising:

display means included in said television receiver for selectively providing a display indication in response to a display control signal; and said appliance control means including means for generating said display control signal in response to said second predetermined type of data.

5. A remote control apparatus in accordance with claim 1 wherein:

said appliance control means include means for generating a sequential digital data signal representative of said second predetermined type of data; and said alternating current line modulator means includes means for modulating a carrier signal in accordance with said sequential digital data signal, and means for modulating the alternating current power supply line in accordance with said modulated carrier signal.

6. A remote control apparatus in accordance with claim 5 further comprising:

alternating current line demodulator means coupled to said alternating current power supply line for decoding said encoded sequential digital data signal representative of said appliance control signal on said alternating current power supply line; and second appliance control means coupled to said alternating current line demodulator means for decoding said sequential digital data signal and selectively providing an alternating current power output in accordance with said second predetermined type of data.

7. A remote control apparatus in accordance with claim 1 further comprising:

alternating current line demodulator means coupled to said alternating current power supply line for decoding said encoded signal representative of said appliance control signal on said alternating current power supply line; and second appliance control means coupled to said alternating current line demodulator means for decoding said appliance control signal and selectively providing an alternating current power output in accordance with said second predetermined type of data.

8. In a remote control television system including a remote control unit having a transmitter means for transmitting a carrier signal, keyboard means for entering data, and encoder means for modulating said carrier signal in accordance with said entered data, and further including a television receiver having receiving means for receiving said carrier signal, decoding means for demodulating said entered data, and television function control means coupled to said decoding means for controlling various functions of said television receiver in response to a first predetermined type of data received from said decoding means, the improvement comprising:

control means coupled to said decoding means for generating an output signal in response to a second predetermined type of data received from said decoding means;

encoder means responsive to said output signal of said control means for generating a sequential digital data signal representative of said second predetermined type of data; and ultrasonic transmitter means responsive to said encoder means for generating an encoded ultrasonic signal representative of said sequential data signal.

9. A remote control apparatus according to claim 8 further comprising:

ultrasonic receiver means for receiving said encoded ultrasonic signal;

appliance control means coupled to said ultrasonic receiver means for generating a second sequential digital data signal representative of said second predetermined type of data; and alternating current line modulator means responsive to said second sequential digital data signal, and coupled to an alternating current power supply line for applying an encoded signal representative of said second predetermined type of data to said alternating current power supply line.

10. A remote control apparatus according to claim 9 further comprising:

alternating current line demodulator means coupled to said alternating current power supply line for decoding said encoded second sequential digital data signal representative of said second predetermined type of data on said alternating current power supply line; and second appliance control means coupled to said alternating current line demodulator means for decoding said second sequential digital data signal and selectively providing an alternating current power output in accordance with said second predetermined type of data.

11. In a television receiver including keyboard means for entering data, decoding means for demodulating said entered data, and television function control means coupled to said decoding means for controlling various functions of said television receiver in response to a first predetermined type of data received from said decoding means, the improvement comprising:

means for coupling a plurality of external lines to said television receiver;

external line selection means coupled to said decoding means for generating an external line selection signal in response to a second predetermined type of data received from said decoding means, said second predetermined type of data being characterized by a number having a first digit corresponding to an unused selected television channel and having at least a second digit corresponding to respective ones of said plurality of external lines;

mode control means included in said external line selection means for detecting when said data received from said decoding means represents said number corresponding to said unused selected television channel; and means coupled to said coupling means for selecting one of said plurality of external lines in accordance with said second digit in response to said external line selection signal.

12. In a television receiver in accordance with claim 11 wherein said keyboard means includes means for entering numeric data corresponding to first and second digits of the channel number of the channel to be selected, and said second predetermined type of data is characterized by a sequence of numbers having a first digit thereof corresponding to the number 9, the improvement further comprising:

said mode control means being for detecting said first digit of said data received from said decoding means representing the number 9.

13. In a television receiver in accordance with claim 11 or 12, the improvement further comprising:

display means included in said television receiver for selectively providing a display indication in response to a display control signal; and said external line selection means including means for generating said display control signal in response to said second predetermined type of data.

14. In a television receiver including keyboard means for entering data, decoding means for demodulating said entered data, and television function control means coupled to said decoding means for controlling various functions of said television receiver in response to a first predetermined type of data received from said decoding means, the improvement comprising:

external apparatus selection means coupled to said decoding means for generating an external apparatus selection signal in response to a second predetermined type of data received from said decoding means, said second predetermined type of data being characterized by a number having at least one digit corresponding to an unused selected television channel;

mode control means included in said external apparatus selection means for detecting when said data received from said decoding means represents said number corresponding to said unused selected television channel; and line modulator means coupled to a line external to said television receiver for applying to said external line an encoded signal responsive to said external apparatus selection signal.

15. In a television receiver in accordance with claim 14 wherein said keyboard means includes means for entering numeric data corresponding to first and second digits of the channel number of the channel to be selected, and said second predetermined type of data is characterized by a sequence of numbers having a first digit thereof corresponding to the number 9, the improvement further comprising:

said mode control means being for detecting said first digit of said data received from said decoding means representing the number 9.

16. In a television receiver in accordance with claim 14 or 15, the improvement further comprising:

display means included in said television receiver for selectively providing a display indication in response to a display control signal; and said external apparatus selection means including means for generating said display control signal in response to said second predetermined type of data.

17. In a remote control television system including a remote control unit having a transmitter means for transmitting a carrier signal, keyboard means for entering data, and encoder means for modulating said carrier signal in accordance with said entered data, and further including a television receiver having receiving means for receiving said carrier signal, decoding means for demodulating said entered data, and television function control means coupled to said decoding means for controlling various functions of said television receiver in response to a first predetermined type of data received from said decoding means, the improvement comprising:

external apparatus control means coupled to said decoding means for generating an external apparatus control signal in response to a second predetermined type of data received from said decoding means, said second predetermined type of data being characterized by a number having at least one digit corresponding to an unused selected television channel;

mode control means included in said external apparatus control means for detecting when said data received from said decoding means represents said number corresponding to said unused selected television channel; and line modulator means coupled to a line external to said television receiver for applying to said external line an encoded signal responsive to said external apparatus control signal.

18. In a remote control television system in accordance with claim 17 wherein said keyboard means includes means for entering numeric data corresponding to first and second digits of the channel number of the channel to be selected, and said second predetermined type of data is characterized by a sequence of numbers having a first digit thereof corresponding to the number 9, the improvement further comprising:

said mode control means being for detecting said first digit of said data received from said decoding means representing the number 9.

19. In a remote control television system in accordance with claim 17 or 18, the improvement further comprising:

display means included in said television receiver for selectively providing a display indication in response to a display control signal; and said external apparatus control means including means for generating said display control signal in response to said second predetermined type of data.

* * * * *